United States Patent
Zhuang et al.

(10) Patent No.: US 7,029,982 B1
(45) Date of Patent: Apr. 18, 2006

(54) METHOD OF AFFECTING RRAM CHARACTERISTICS BY DOPING PCMO THIN FILMS

(75) Inventors: Wei-Wei Zhuang, Vancouver, WA (US); David R. Evans, Beaverton, OR (US); Fengyan Zhang, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/971,387

(22) Filed: Oct. 21, 2004

(51) Int. Cl.
*H01L 21/20* (2006.01)

(52) U.S. Cl. .................. 438/384; 438/3; 438/382; 438/385

(58) Field of Classification Search .................. 438/3, 438/240, 381, 382, 383, 384, 385, 330, 238
See application file for complete search history.

(56) References Cited

U.S. PATENT DOCUMENTS

| | | |
|---|---|---|
| 6,204,139 B1 | 3/2001 | Liu et al. |
| 6,911,361 B1 * | 6/2005 | Zhang et al. ............... 438/240 |
| 6,927,120 B1 * | 8/2005 | Hsu et al. .................. 438/396 |
| 6,939,724 B1 * | 9/2005 | Zhuang et al. ................ 438/3 |
| 6,972,211 B1 * | 12/2005 | Hsu et al. .................. 438/384 |
| 6,972,238 B1 * | 12/2005 | Hsu et al. .................. 438/382 |
| 6,972,239 B1 * | 12/2005 | Li et al. .................... 438/384 |

OTHER PUBLICATIONS

U.S. Appl. No. 10/759,468, filed Jan. 15, 2004, Zhuang et al.
Liu et al., *Electric-pulse-induced reversible resistance change effect in magnetoresistive films*, Applied Physics Letters, vol. 76, No. 19; May 8, 2000, pp 2749-2751.

* cited by examiner

*Primary Examiner*—Kevin M. Picardat
(74) *Attorney, Agent, or Firm*—David C. Ripma

(57) ABSTRACT

A method of fabricating a doped-PCMO thin film layer includes preparing a PCMO precursor solution having a transition metal additive therein; and spin-coating the doped-PCMO spin-coating solution onto a wafer.

10 Claims, 4 Drawing Sheets

METHOD OF AFFECTING RRAM CHARACTERISTICS BY DOPING PCMO THIN FILMS

FIELD OF THE INVENTION

This invention relates to the preparation of a $Pr_{0.7}Ca_{0.3}MnO_3$ (PCMO) spin-coating, thin film precursor and the doping of a PCMO layer, in order to modify the PCMO thin film's reversible resistance switch properties.

BACKGROUND OF THE INVENTION

The reversible resistance switch properties of $Pr_{0.7}Ca_{0.3}MnO_3$ (PCMO) metal oxide thin films by applying nanoseconds short electric pulses has been disclosed by Liu et al., *Electric-pulse-induced Reversible Resistance Change Effect in Magnetoresistive Films*, Applied Physics Letters, Vol. 76, No. 19, pp2749–2751 (2000) and U.S. Pat. No. 6,204,139 B1, to Liu et al., granted Mar. 20, 2001, for Method for Switching the Properties of Perovskite Materials Used in Thin Film Resistors. The PCMO thin films described therein were grown on epitaxial $YBa_2Cu_3O_7$ (YBCO), or partial epitaxial Pt/LAO ($LaAlO_3$), substrates via pulsed laser abrasion (PLA) techniques. XRD polar figures disclosed in the cited references indicate conventional epitaxial properties of PCMO thin films, and indicate that colossal magnetoresistance (CMR) materials have reversible resistance change property at room temperature.

The structure of a PCMO thin film integrated with a silicon wafer is known, and methods to achieve electrically reversible resistance changes are also known. A method for the synthesis of a stable spin-coating PCMO precursor solution through the pre-thermal treatment of $Mn(OAc)_3$ $(2H_2O)$ is disclosed in PCMO Spin Coating Deposition, Ser. No. 10/759,468, filed Jan. 15, 2004.

SUMMARY OF THE INVENTION

A method of fabricating a doped-PCMO thin film layer includes preparing a PCMO precursor solution, including: dehydrating $Ca(OAc)_2(H_2O)$ and $Mn(OAc)_3(2H_2O)$; mixing $Pr(OAc)_3(H_2O)$, $Ca(OAc)_2(H_2O)$ and $Mn(OAc)_3$ $(2H_2O)$; adding a transition metal additive to the PCMO precursor solution; dissolving the PCMO chemicals and transition metal additive in an organic solvent; heating the doped-PCMO precursor solution at between about 90° to 120° for between about one hour to eight hours; filtering the doped-PCMO through a 0.2 μm filter; thereby forming doped-PCMO spin-coating solution; spin-coating the doped-PCMO spin-coating solution onto a wafer by: injecting the doped-PCMO spin-coating solution onto a wafer surface; spinning the wafer at about 2500 RPM for about 45 seconds; baking the coated wafer at about 180° for about one minute; ramping the baking temperature up to about 230°, and baking for about one minute; annealing the wafer in a RTA furnace at about 500° for about five minutes; repeating the spin-coating process at least three times to fabricate a doped-PCMO layer; and annealing the wafer at between about 500° to 600° for between about one hour to six hours in dry, clean air.

It is an object of the invention to fabricate a doped-PCMO layer in a single deposition step.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The prior art, as described in the references of Liu et al., teaches that $Pr_{0.7}Ca_{0.3}MnO_3$ (PCMO) thin films exhibit reversible resistance change properties when electric pulses are applied to the thin films at room temperature, wherein the resistance change is controlled by the polarity of electric pulses. The resistance increases by applying a short positive pulse, and the resistance decreases by applying a short negative pulse. The PCMO thin films were deposited on both epitaxial $YBa_2Cu_3O_7$ (YBCO) and partial epitaxial platinum substrates by pulsed laser deposition method (PLD).

In U.S. patent application Ser. No. 10/759,468, filed Jan. 15, 2004, for PCMO Spin Coating Deposition, synthesis of a PCMO precursor and application of the precursor by spin-coating is described. The PCMO thin films thus formed exhibit reversible resistance switching upon application of short electric pulses.

The method of the invention herein provides a method of doping a PCMO thin film for use in RRAM devices, to adjust the electrical properties thereof so that a doped-PCMO thin film may be fabricated in a single step deposition.

Figure 1:
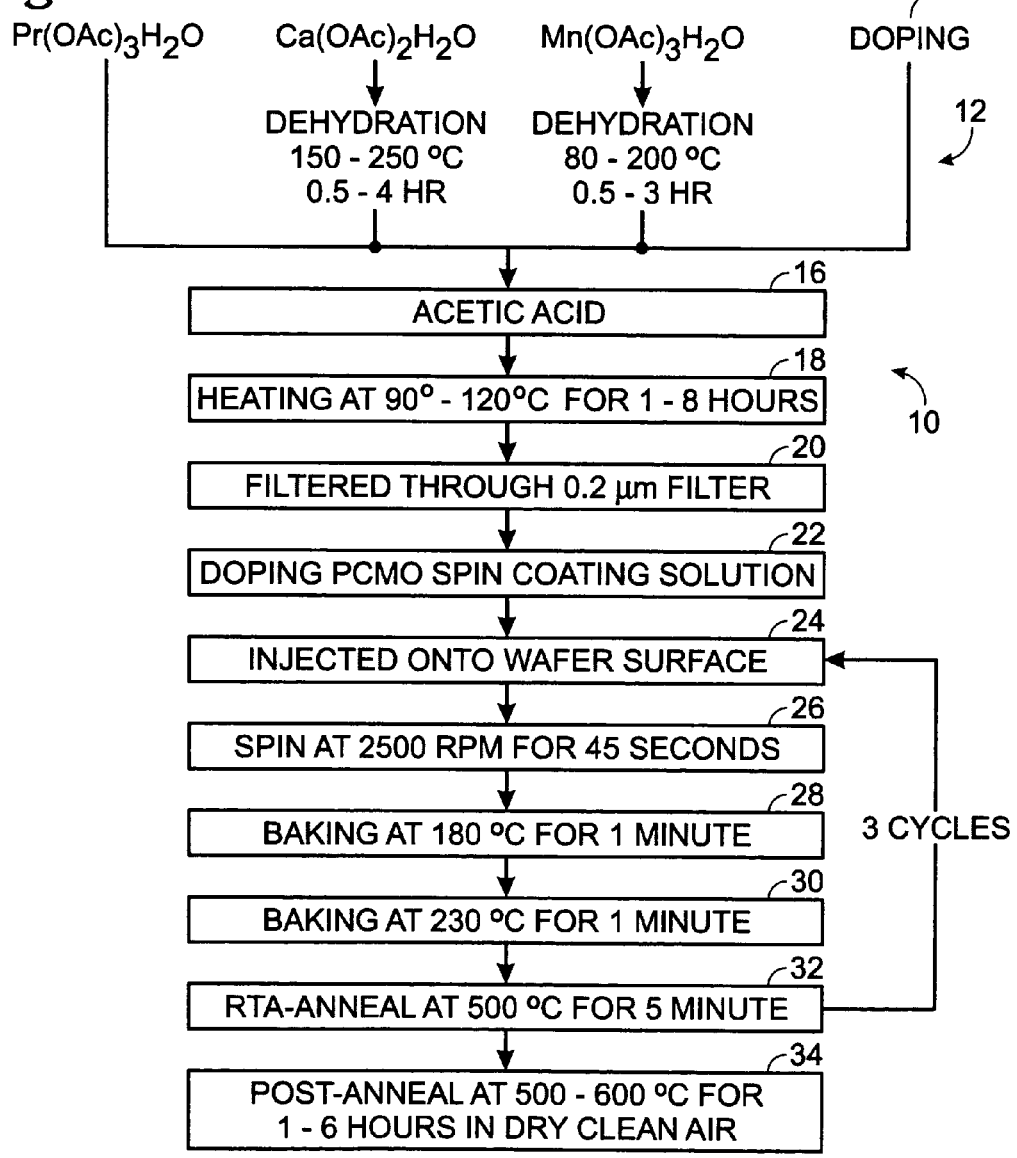
FIG. 1 depicts steps in preparation of a doped PCMO precursor and spin-coating process used in the method of the invention.

Referring now to FIG. 1, the method of the invention is depicted generally at 10. Raw chemicals used for the PCMO synthesis are $Pr(OAc)_3(H_2O)$, $Ca(OAc)_2(H_2O)$ and $Mn(OAc)_3(2H_2O)$, where OAc is $OOCCH_3$, 12. Both $Ca(OAc)_2(H_2O)$ and $Mn(OAc)_3(2H_2O)$ are subjected to a pre-thermal, dehydration treatment. A doping element 14, which is a transition metal additive, such as V, Cr, Co, Fe, Ni, Ti, Zr, Hf, Nb, Ta, Mo W and Zn, is mixed with the PCMO chemicals. The amount of doping ranges from between about 0.01 mol % to 10 mol % of the transition metal additive to the PCMO. The organic solvent used in the method of the invention is acetic acid HOAc, 16. The dopant-bearing PCMO precursor and acetic acid solvent are heated at between about 90° to 120° for between about one hour to eight hours, 18. The solution is filtered through a 0.2 μm filter, 20, resulting in doped-PCMO spin-coating solution, 22. A doped PCMO thin film is formed by spin-coating the doped-PCMO spin-coating solution onto a $Pt/Ti/SiO_2/$ wafer substrate. The PCMO spin-coating solution is injected onto a wafer surface, 24, wherein the wafer is spinning at about 2500 RPM, 26, which spin rate is maintained for about 45 seconds. The coated wafer is baked at about 180° for about one minute, 28, then the temperature is ramped up to about 230° for about one minute, 30. The wafer is the annealed in a RTA furnace at about 500° for about five minutes, 32. The spin-coating process is repeated at least three times, to fabricate a doped-PCMO layer. Once the doped-PCMO layer is complete, the wafer is annealed at between about 500° to 600° for between about one hour to six hours in dry, clean air, 34.

The initial doping experiments indicated the influence of doping on PCMO thin film RRAM properties as described in the following examples:

Example 1

Spin-coating solution 22 includes a 0.1 mol % Cr metal additive in the form of chromium(III) acetate hydroxide $(CH_3CO_2)_7Cr_3(OH)_2$. Three-layers of Cr-doped PCMO thin film were deposited on a $Pt/Ti/SiO_2/Si$ wafer substrate via spin-coating. A platinum the top electrode having a thickness of about 200 μm was formed on the Cr-doped PCMO film. After post-annealing at 525° C. for about 40 minutes, the resistance of the thin film dropped from 300 kΩ to 20 kΩ, however, no resistance switches were observed regardless of the kind or duration of applied electrical pulse.

Example 2

Figure 2:
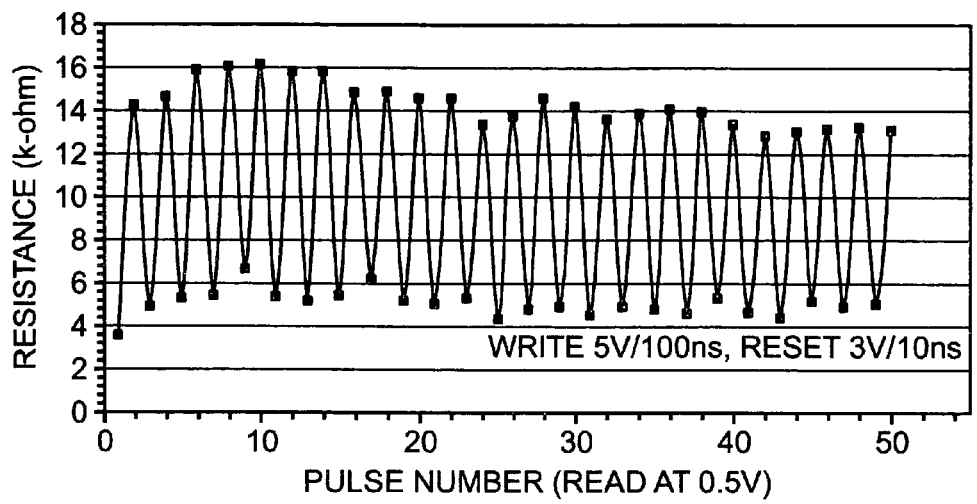
FIG. 2 depicts properties of a Cr-doped PCMO thin film resistance switch.

Following the results of the first test, the Cr metal additive was reduced to about 0.05 mol % in the PCMO thin film. Again, chromium(III) acetate hydroxide was used as the chromium additive. Three-layers of Cr doped PCMO thin film were deposited on a $Pt/Ti/SiO_2/Si$ wafer substrate via spin-coating. A platinum top electrode having a thickness of about 200 μm was formed on the Cr-doped PCMO thin film. After post-annealing at 525° C. for about 40 minutes, the resistance of the thin film was dropped from 300 kΩ to 20 kΩ, and reversible resistance switch characteristics were observed, as shown in FIG. 2.

Figure 3:
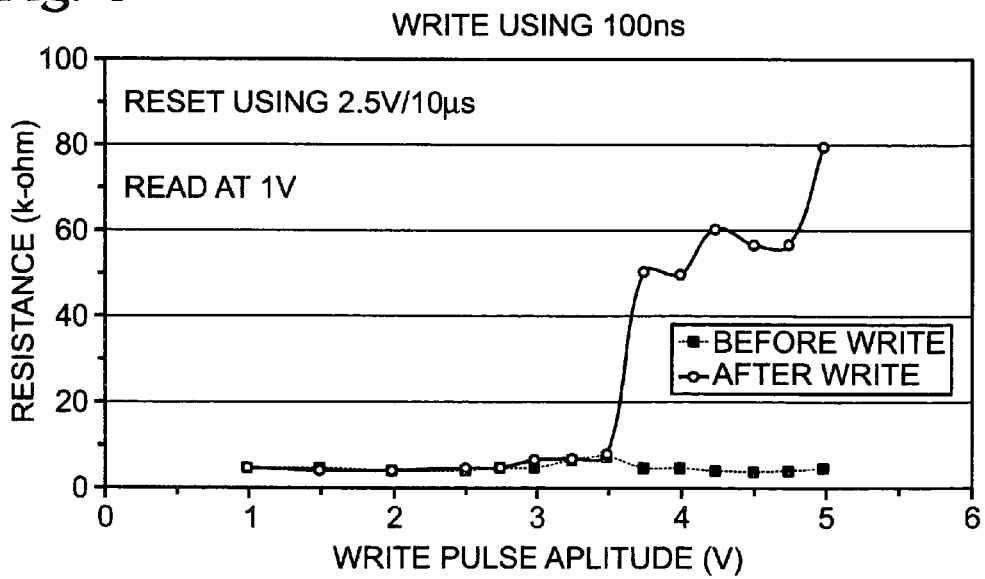
FIGS. 3–6 depict Cr-doped PCMO thin film characteristics.
Figure 4:
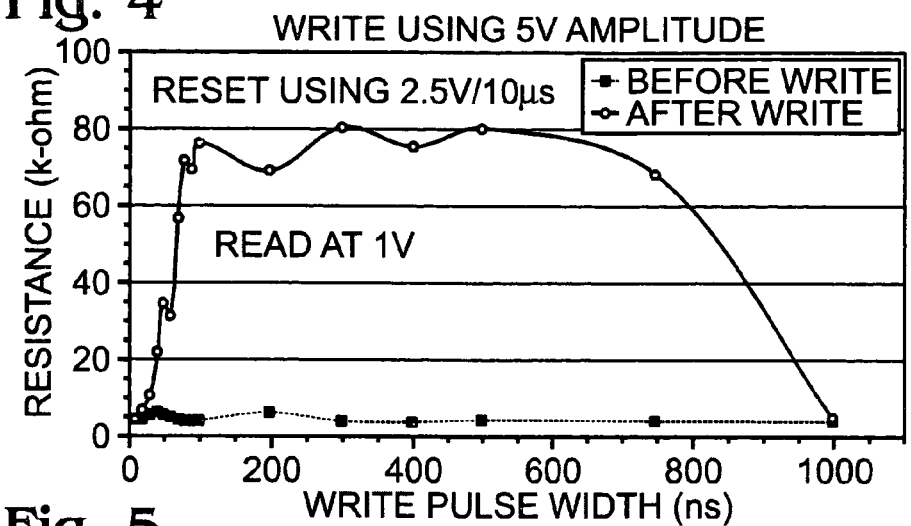
Figure 5:
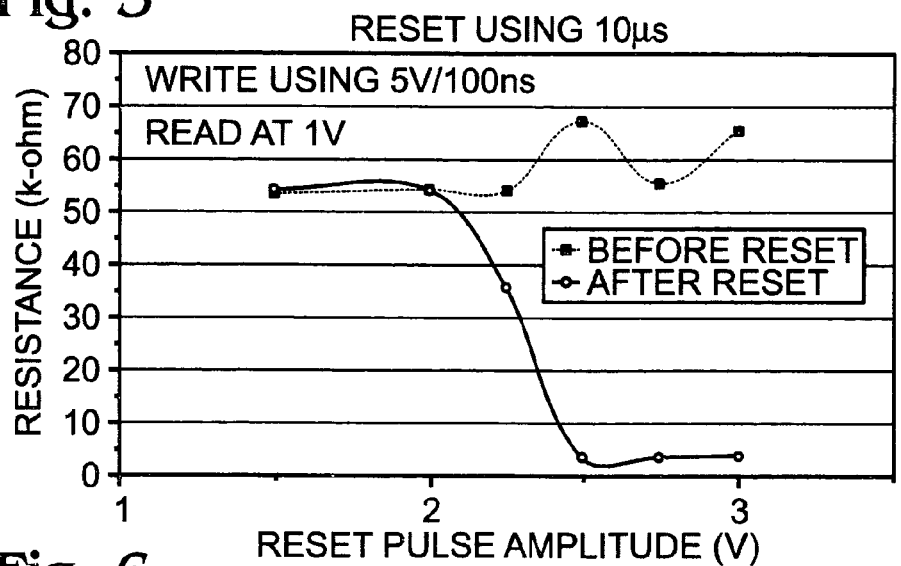
Figure 6:
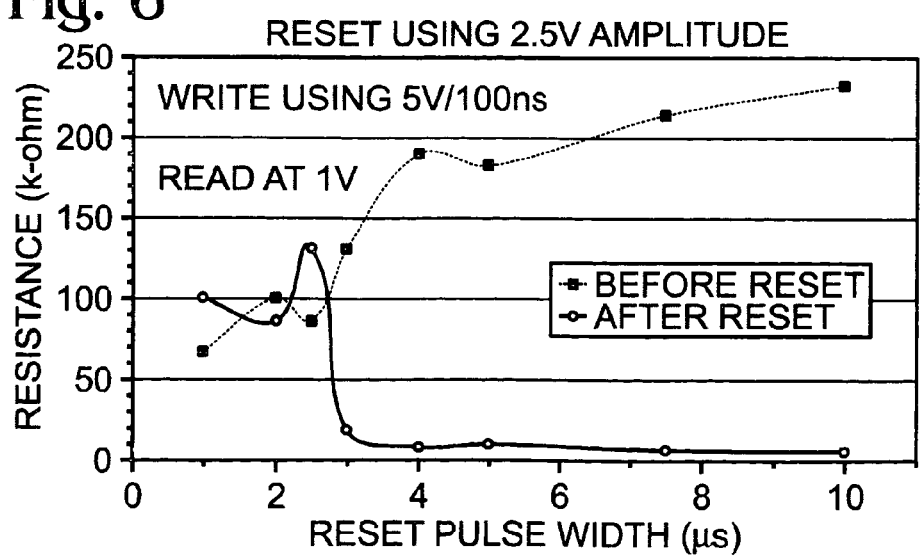
Figure 7:
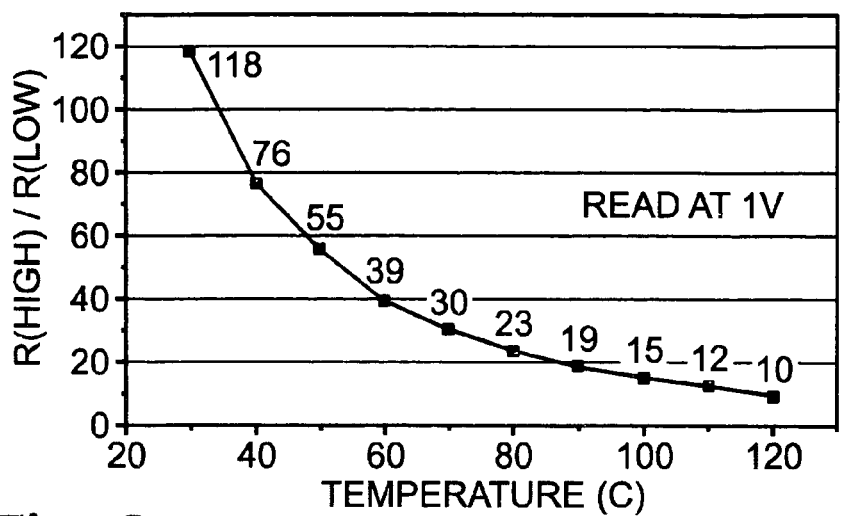
FIGS. 7 and 8 depict temperature dependent characteristics of Cr-doped PCMO thin films.

The doped PCMO thin film of Example 2 required a 5V/100 ns electric pulse for write operations, and a 3V/10 ms pulse for reset operations. The Cr-doped PCMO thin film resistance switch efficiencies are shown in FIGS. 3–6, wherein FIG. 3 depicts a write pulse voltage dependency; FIG. 4 depicts a write pulse width dependency; FIG. 6 depicts the reset pulse voltage dependency; and FIG. 7 depicts the reset pulse width dependency. The write threshold voltage is 3.5V, and the pulse threshold width is 75 ns. For the reset process, the threshold voltage and pulse width are 2.5V and 3 μs, respectively.

Figure 8:
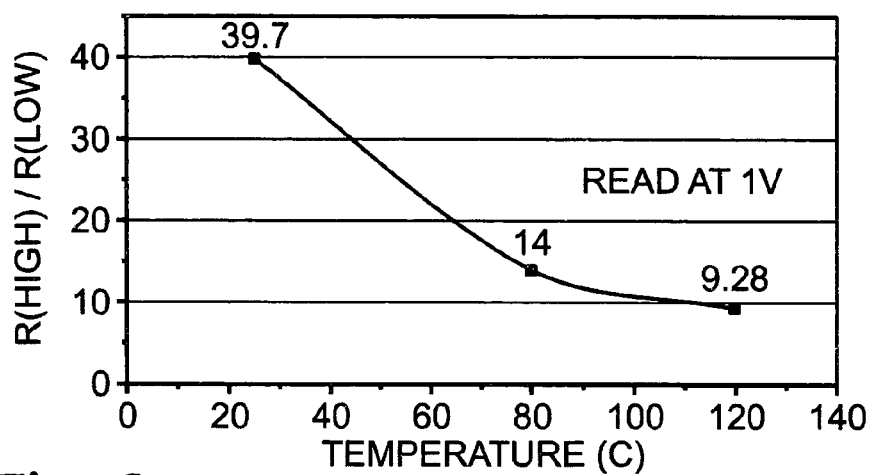
Figure 9:
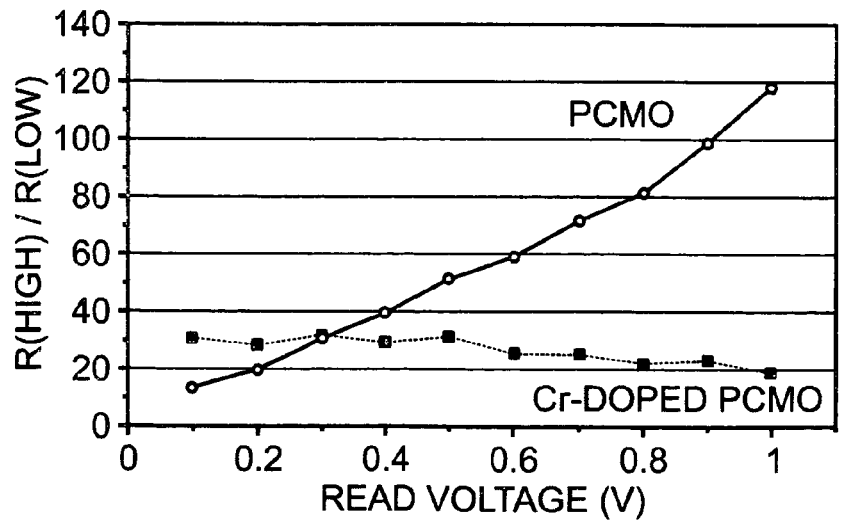
FIG. 9 depicts the effect of Cr-doped PCMO thin film on resistance measurements

FIG. 7 depicts PCMO high temperature dependency, while FIG. 8 depicts the high temperature dependency of a Cr-doped PCMO thin film. Comparing FIGS. 7 and 8, the Cr-doped PCMO thin film exhibited a much lower temperature dependency. The effect of Cr-doping vs. un-doped PCMO on resistance is shown in FIG. 9. The Cr-doped PCMO thin film exhibits a much smaller resistance measurement voltage influence than does the un-doped PCMO thin film.

Example 3

In this example, a 0.05 mol % of vanadium was introduced into the PCMO thin film. Vanadyl acetylacetonate, $[CH_3COCHCOCH_3]_2VO$, was used as the vanadium additive compound. As in previous examples, three-layers of V-doped PCMO thin film were deposited on a platinum substrate via spin-coating, and a platinum top electrode formed on the V-doped PCMO. After post-annealing at about 525° C. for about 40 minutes, the thin film exhibited the requisite RRAM properties, however, the number of switch cycles proved to be limited, after which the V-doped PCMO thin film layer appeared to suffer irreparable damage.

Thus, a method for doping a PCMO thin film to enhance reversible resistance properties thereof has been disclosed. It will be appreciated that further variations and modifications thereof may be made within the scope of the invention as defined in the appended claims.

We claim:

1. A method of fabricating a doped-PCMO thin film layer comprising:
    preparing a PCMO precursor solution, including:
        dehydrating $Ca(OAc)_2(H_2O)$ and $Mn(OAc)_3(2H_2O)$;
        mixing $Pr(OAc)_3(H_2O)$, $Ca(OAc)_2(H_2O)$ and $Mn(OAc)_3(2H_2O)$;
        adding a transition metal additive to the PCMO precursor solution;
        dissolving the PCMO chemicals and transition metal additive in an organic solvent;
    heating the doped-PCMO precursor solution at between about 90° to 120° for between about one hour to eight hours;
    filtering the doped-PCMO through a 0.2 μm filter; thereby forming doped-PCMO spin-coating solution;
    spin-coating the doped-PCMO spin-coating solution onto a wafer by:
        injecting the doped-PCMO spin-coating solution onto a wafer surface;
        spinning the wafer at about 2500 RPM for about 45 seconds;
        baking the coated wafer at about 180° for about one minute;
        ramping the baking temperature up to about 230°, and baking for about one minute;
        annealing the wafer in a RTA furnace at about 500° for about five minutes;
    repeating the spin-coating process at least three times to fabricate a doped-PCMO layer; and
    annealing the wafer at between about 500° to 600° for between about one hour to six hours in dry, clean air.

2. The method of claim 1 wherein said adding includes selecting a transition metal additive from the group of transition metal additives consisting of V, Cr, Co, Fe, Ni, Ti, Zr, Hf, Nb, Ta, Mo W and Zn.

3. The method of claim 2 wherein said adding includes adding a transition metal additive in a ranges of between about 0.01 mol % to 10 mol % of the transition metal additive to the PCMO.

4. The method of claim 1 wherein the organic solvent is acetic acid to form a doped-PCMO precursor solution.

5. A method of fabricating a doped-PCMO thin film layer comprising:
    preparing a PCMO precursor solution, including:
        dehydrating $Ca(OAc)_2(H_2O)$ and $Mn(OAc)_3(2H_2O)$;
        mixing $Pr(OAc)_3(H_2O)$, $Ca(OAc)_2(H_2O)$ and $Mn(OAc)_3(2H_2O)$;
        adding a transition metal additive to the PCMO precursor solution, including selecting a transition metal additive from the group of transition metal additives consisting of V, Cr, Co, Fe, Ni, Ti, Zr, Hf, Nb, Ta, Mo W and Zn;
        dissolving the PCMO chemicals and transition metal additive in an organic solvent;
    heating the doped-PCMO precursor solution at between about 90° to 120° for between about one hour to eight hours;
    filtering the doped-PCMO through a 0.2 μm filter; thereby forming doped-PCMO spin-coating solution;

spin-coating the doped-PCMO spin-coating solution onto a wafer by:
  injecting the doped-PCMO spin-coating solution onto a wafer surface;
  spinning the wafer at about 2500 RPM for about 45 seconds;
  baking the coated wafer at about 180° for about one minute;
  ramping the baking temperature up to about 230°, and baking for about one minute;
  annealing the wafer in a RTA furnace at about 500° for about five minutes;
repeating the spin-coating process at least three times to fabricate a doped-PCMO layer; and
annealing the wafer at between about 500° to 600° for between about one hour to six hours in dry, clean air.

6. The method of claim 5 wherein said adding includes adding a transition metal additive in a range of between about 0.01 mol % to 10 mol % of the transition metal additive to the PCMO.

7. The method of claim 5 wherein the organic solvent is acetic acid to form a doped-PCMO precursor solution.

8. A method of fabricating a doped-PCMO thin film layer comprising:
  preparing a PCMO precursor solution, including:
    dehydrating $Ca(OAc)_2(H_2O)$ and $Mn(OAc)_3(2H_2O)$;
    mixing $Pr(OAc)_3(H_2O)$, $Ca(OAc)_2(H_2O)$ and $Mn(OAc)_3(2H_2O)$;
    adding a transition metal additive to the PCMO precursor solution, including selecting a transition metal additive from the group of transition metal additives consisting of V and Cr;
    dissolving the PCMO chemicals and transition metal additive in an organic solvent;
  heating the doped-PCMO precursor solution at between about 90° to 120° for between about one hour to eight hours;
  filtering the doped-PCMO through a 0.2 μm filter; thereby forming doped-PCMO spin-coating solution;
  spin-coating the doped-PCMO spin-coating solution onto a wafer by:
    injecting the doped-PCMO spin-coating solution onto a wafer surface;
    spinning the wafer at about 2500 RPM for about 45 seconds;
    baking the coated wafer at about 180° for about one minute;
    ramping the baking temperature up to about 230°, and baking for about one minute;
    annealing the wafer in a RTA furnace at about 500° for about five minutes;
  repeating the spin-coating process at least three times to fabricate a doped-PCMO layer; and
  annealing the wafer at between about 500° to 600° for between about one hour to six hours in dry, clean air.

9. The method of claim 8 wherein said adding includes adding the transition metal additive in a range of between about 0.01 mol % to 10 mol % of the transition metal additive to the PCMO.

10. The method of claim 8 wherein the organic solvent is acetic acid to form a doped-PCMO precursor solution.

* * * * *